(12) United States Patent
Lien et al.

(10) Patent No.: US 6,878,964 B1
(45) Date of Patent: Apr. 12, 2005

(54) GROUND-SIGNAL-GROUND PAD LAYOUT FOR DEVICE TESTER STRUCTURE

(75) Inventors: Wai-Yi Lien, Hsin-Chu (TW); Jyh-Chyurn Guo, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 4 days.

(21) Appl. No.: 10/672,608

(22) Filed: Sep. 26, 2003

(51) Int. Cl.[7] ............................................. H01L 23/58
(52) U.S. Cl. ........................... 257/48; 438/14; 438/17; 438/18
(58) Field of Search ............................ 257/48; 438/14, 438/17, 18

(56) References Cited

U.S. PATENT DOCUMENTS

6,194,739 B1  2/2001  Ivanov et al.
6,211,541 B1  4/2001  Carroll et al.

Primary Examiner—Long Pham
(74) Attorney, Agent, or Firm—Slater & Matsil, L.L.P.

(57) ABSTRACT

A tester for a semiconductor device is provided, which includes a bottom ground pad structure, an intermediate ground pad structure, and a top layer. The bottom ground pad structure is electrically connected to a substrate. The bottom ground pad structure includes a bottom signal shield plate. The intermediate ground pad structure is electrically connected to the bottom ground pad structure. The intermediate ground pad structure is located over the bottom ground pad structure. The top layer is located over the intermediate ground pad structure. The top layer includes a device under test (DUT), a ground probe pad, a signal probe pad, and leads. The DUT is electrically connected to the ground probe pad and the signal probe pad via the leads. The ground probe pad is electrically connected to the intermediate ground pad structure. The signal probe pad is located over the bottom signal shield plate.

23 Claims, 7 Drawing Sheets

GROUND-SIGNAL-GROUND PAD LAYOUT FOR DEVICE TESTER STRUCTURE

TECHNICAL FIELD

The present invention generally relates to semiconductor devices. In one aspect it relates more particularly to a ground-signal-ground (GSG) pad layout for RF CMOS device testing structure.

BACKGROUND

Semiconductor integrated circuits (ICs) are typically formed on semiconductor substrates in a manufacturing or fabrication process. Silicon wafers are usually employed to provide a common substrate for the components of the ICs. Numerous ICs (also called dies or chips) are formed on and in each wafer. The ICs formed on semiconductor substrates, such as silicon wafers, typically include a variety of basic electrical components, such as transistors, amplifiers, resistors, and capacitors, for example. It is desirable to verify that such integrated basic components are fabricated according to a design specification and have certain electrical properties or values (e.g., a specified gain, resistance, etc). However, an individual component usually cannot be readily tested after being integrated into a circuit.

In lieu of testing the integrated components (i.e. the components that are part of the ICs on the wafer that will be sold), "stand-alone" copies of such basic components are often tested. The stand-alone copies are typically fabricated in some separate location of the surface of the wafer not occupied by the dies or ICs formed on the wafer. Such stand-alone copies or "target components" have electrical properties or values of gain, resistance, and the like that are representative of such properties for their IC counterparts because they are fabricated using the same process (and typically during the same process). As such, it may be assumed that the parameters measured for the target components are similar to those of the non-tested integrated components. Thus, the test results of the stand-alone copies provide an indication of the electrical properties for the integrated components that will be sold. This type of quality control methodology is often referred to as "in-process electrical testing."

During in-process electrical testing, a signal source and a measurement device (usually external) are electrically connected to the stand-alone target component to be tested, or the "device under test" (DUT). Electrical connection is typically effected via microprobes, one of which is attached to an end of a coaxial cable carrying a signal from the signal source (providing a test input signal), and another of which is attached to an end of a coaxial cable leading to the measurement device (collecting the output response from the target component).

On the wafer, the target component or DUT is electrically connected to pads. The microprobes contact the pads, thereby electrically connecting the signal source and the measurement device to the DUT. The measurement device is typically used to measure various response or performance parameters of the DUT (i.e. parameters which characterize the response or performance of the DUT). The pads and the DUT, collectively, form a "process monitor" or "device monitor," sometimes referred to as a "tester." Some of the wafer surface is typically reserved for such testers. This reserved surface usually cannot be utilized for devices forming part of the ICs.

Sometimes the leads to the DUT themselves hinder the measurement of the DUT itself because the leads exhibit physical characteristics that mask or obscure the physical characteristics of the DUT. Thus, to accurately measure the physical characteristics of the DUT, the physical characteristics of the leads, which are known as "parasitics," must be understood so that they can be factored out to reveal the true characteristics of the DUT. The process of factoring-out or extracting parasitics is referred to as "de-embedding." One method for de-embedding parasitics involves, for example, analyzing four different DUTs that are fabricated with the same process and in accordance with the same design specifications as the IC devices of interest. These four DUTs are widely-known to those skilled in the art as "short," "load," "open," and "thru" DUTs.

It is through the probe pads that the physical characteristics of the DUTs are measured using external measuring equipment. From these measurements, the parasitics of the leads can be determined and applied in well-known fashion to de-embed the parasitics and reveal the "true" parameters of the nominal DUT. Although this technique for de-embedding parasitics is well known and widely used, its use is problematic in some applications. In particular, integrated circuits with conductive substrates (e.g., silicon substrates, etc.) that operate at high frequencies generate particularly strong parasitics that hinder the de-embedding process. Current radio frequency (RF) ground-signal-ground (GSG) pad patterns have high parasitics; many times due to low CMOS substrate resistively, for example. Such parasitics also may cause coupling between the two ports of the DUT, which makes de-embedding more difficult or not possible. Therefore, a need exists for ways to de-embed parasitics associated with DUT leads and measurement probes for devices formed on conductive substrates and that operate at high frequencies (e.g., GHz ranges).

SUMMARY OF THE INVENTION

The problems and needs outlined above are addressed by embodiments of the present invention. In accordance with one aspect of the present invention, a tester for a semiconductor device is provided, which includes a bottom ground pad structure, an intermediate ground pad structure, and a top layer. The bottom ground pad structure is electrically connected to a substrate. The bottom ground pad structure includes a bottom signal shield plate. The intermediate ground pad structure is electrically connected to the bottom ground pad structure. The intermediate ground pad structure is located over the bottom ground pad structure. The top layer is located over the intermediate ground pad structure. The top layer includes a device under test (DUT), a ground probe pad, a signal probe pad, and leads. The DUT is electrically connected to the ground probe pad and the signal probe pad via the leads. The ground probe pad is electrically connected to the intermediate ground pad structure. The signal probe pad is located over the bottom signal shield plate.

The tester may further include a bottom series of contacts located between the bottom ground pad structure and the substrate, wherein the bottom ground pad structure is electrically connected to the substrate via the bottom series of contacts. The tester may further include an intermediate series of contacts located between the bottom ground pad structure and the intermediate ground pad structure, wherein the intermediate ground pad structure is electrically connected to the bottom ground pad structure via the intermediate series of contacts. Also, the tester may further include a top series of contacts located between the intermediate ground pad structure and the top layer, wherein the ground probe pad is electrically connected to the intermediate ground pad structure via the top series of contacts. The tester may further include another ground probe pad located in the top layer and a top inter-ground connecting line extending between the ground probe pads, wherein the ground probe pads are electrically connected to each other via the top inter-ground connecting line. The top inter-ground connecting line may have about a same width as the ground probe pads. At least one of the leads may be electrically connected between the top inter-ground connecting line and the DUT, such that the ground probe pads are electrically connected to the DUT via the top inter-ground connecting line. The intermediate ground pad structure may include two corner portions and an intermediate inter-ground connecting line, wherein the intermediate inter-ground connecting line extends between and electrically connects the two corner portions. The intermediate interground connecting line may have a smaller width than the corner portions. Each corner portion may have a plate shape or a hollow box shape, for example. The tester may have several intermediate ground pad structures located between the bottom ground pad structure and the top layer.

In accordance with another aspect of the present invention, a tester for a semiconductor device is provided, which includes a bottom layer, at least one intermediate layer, and a top layer. The bottom layer includes a bottom ground pad structure. The bottom ground pad structure is electrically connected to a substrate via a bottom series of contacts. The bottom ground pad structure includes a bottom signal shield plate. Each intermediate layer includes an intermediate ground pad structure. The intermediate ground pad structure is electrically connected to the bottom ground pad structure via an intermediate series of contacts. The top layer includes a device under test (DUT), a ground probe pad, a signal probe pad, and leads. The DUT is electrically connected to the ground probe pad and the signal probe pad via the leads. The ground probe pad is electrically connected to an uppermost one of the at least one intermediate ground pad structure via a top series of contacts. The signal probe pad is located over the bottom signal shield plate.

In accordance with yet another aspect of the present invention, a tester for a semiconductor device is provided, which includes a bottom layer, at least one intermediate layer, and a top layer. The bottom layer includes a bottom ground pad structure. The bottom ground pad structure is electrically connected to a substrate via a bottom series of contacts. The bottom ground pad structure includes four bottom corner portions and two bottom signal shield plates. Each bottom signal shield plate extends between and electrically connects two of the bottom corner portions. Each intermediate layer includes an intermediate ground pad structure. The intermediate ground pad structure is electrically connected to the bottom ground pad structure via an intermediate series of contacts. The intermediate ground pad structure includes four intermediate corner portions and two intermediate inter-ground connecting lines. Each intermediate corner portion is located over one of the bottom corner portions. Each intermediate inter-ground connecting line extends between and electrically connects two of the intermediate corner portions. Each intermediate inter-ground connecting line has a smaller width than the intermediate corner portions. The top layer includes a device under test (DUT), four ground probe pads, two top inter-ground connecting lines, two signal probe pads, and leads. The DUT is electrically connected to the ground probe pads and the signal probe pads via the leads. The ground probe pads are electrically connected to an uppermost one of the at least one intermediate ground pad structure via a top series of contacts. Each signal probe pad is located over one of the bottom signal shield plates. Each ground probe pad is located over one of the intermediate corner portions.

BRIEF DESCRIPTION OF THE DRAWINGS

The following is a brief description of the drawings, which show illustrative embodiments of the present invention and in which.

DETAILED DESCRIPTION OF ILLUSTRATIVE EMBODIMENTS

Referring now to the drawings, wherein like reference numbers are used herein to designate like elements throughout the various views, illustrative embodiments of the present invention are shown and described. The figures are not necessarily drawn to scale, and in some instances the drawings have been exaggerated and/or simplified in places for illustrative purposes only. One of ordinary skill in the art will appreciate the many possible applications and variations of the present invention based on the following illustrative embodiments of the present invention.

One of the obstacles in CMOS RF integrated circuit design is the availability of high-quality models for active and passive components at gigahertz frequencies. A well-characterized RF active and passive components model library is desired to provide a successful RF IC design, to reduce cost, and to reduce time to market. RF components are often characterized by using a vector network analyzer (VNA), which measures vector ratios of reflected and transmitted energy to energy incident upon the device under test (DUT). One of the main interests in RF probing for device characterization purposes is characterizing an intrinsic device for modeling its behavior at gigahertz frequencies when embedded in an IC design environment, for example. When using a DUT for testing such characteristics, the probe pad parasitic effects should be de-embedded from the measurements because the measurements on the wafer with calibrated probe tips includes the intrinsic device characteristics plus the pad parasitics.

FIGS. 1–12 illustrate a tester structure fabricated in accordance with a first embodiment of the present invention. FIGS. 13–20 illustrate a tester structure of a second embodiment of the present invention. These illustrative embodiments shown in FIGS. 1–20 will be described next.

FIGS. 1–4 show various views of a bottom metal layout ($M_1$) formed upon a substrate 24 for the first and second embodiments of the present invention. FIGS. 5–8 show various views of the intermediate metal layout(s) ($M_2$–$M_{TOP-1}$) for the first embodiment. There may be one or more intermediate metal layout layers—hence the notation $M_2$–$M_{TOP-1}$. FIGS. 9–12 show various views for a top metal layout ($M_{TOP}$) of the first embodiment. The second embodiment is a variation on the first embodiment. FIGS. 13–16 show various views of the intermediate metal layout(s) ($M_2$–$M_{TOP-1}$) for the second embodiment. As with the first embodiment, there may be one or more intermediate metal layout layers for the second embodiment. FIGS. 17–20 show various views of for a top metal layout ($M_{TOP}$) of the second embodiment.

Figure 1:
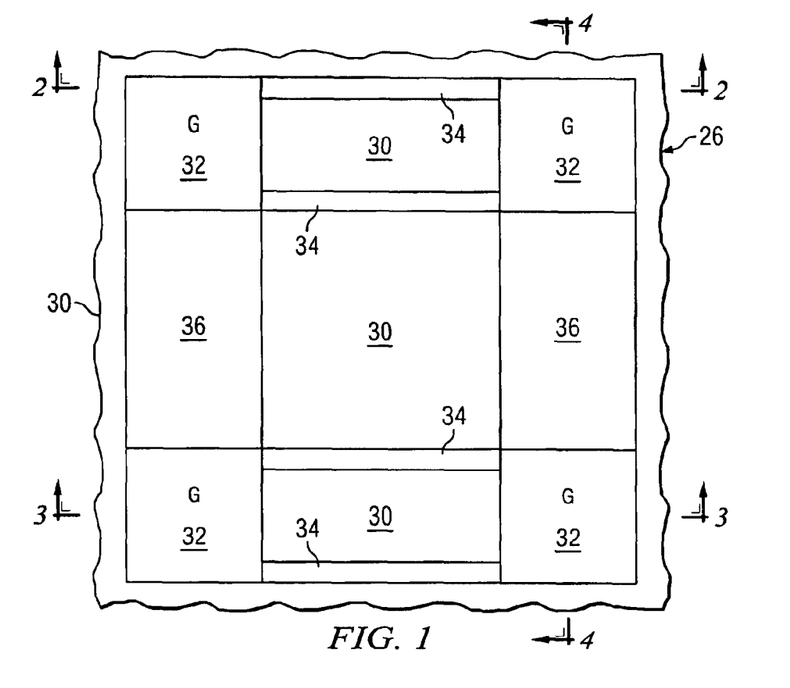
FIGS. 1–4 show various views of a bottom metal layout of a first and a second embodiment of the present invention.
Figure 2:
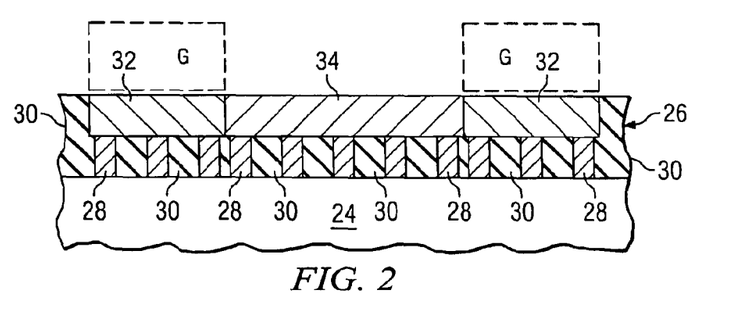
Figure 3:
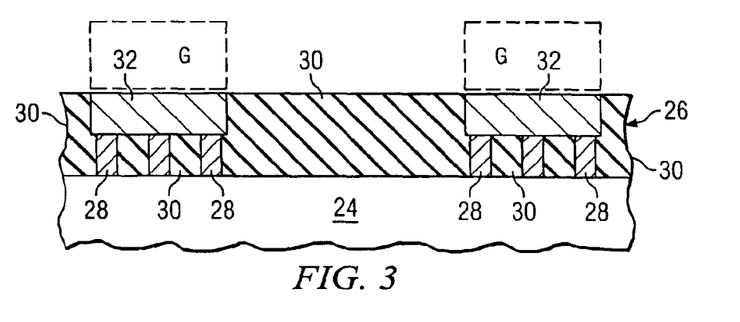
Figure 4:
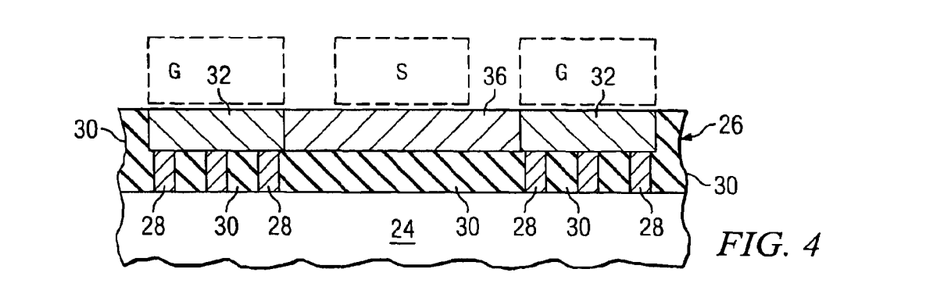

Referring to FIGS. 1–4, FIG. 1 is a top view of the bottom metal layout $M_1$ for the first embodiment. FIGS. 2–4 are sectional views of the bottom metal layout $M_1$ as taken along lines 2—2, 3—3, and 4—4, respectively, in FIG. 1. Note that in FIGS. 2–4, 6–8, 10–12, 14–16, and 18–20, the S and G blocks shown in dashed lines indicate the locations of the signal (S) and ground (G) probe pads in the top metal layout $M_{TOP}$. These S and G blocks are provided for illustrating the locations of the GSG probe pads with respect to other parts of the tester structure.

Still referring to FIGS. 1–4, the bottom metal layout $M_1$ includes a bottom ground pad structure 26. The bottom ground pad structure 26 may be electrically connected to the underlying substrate 24 via a bottom series of contacts 28. Hence, the bottom ground pad structure 26 is grounded to the substrate 24. It is preferred to have the ground pads grounded to the substrate 24 to avoid having floating metal areas and a floating substrate. It is also preferred to use a larger number of contacts 28 to increase the area of conductance between the ground pads and the substrate 24, as this minimizes the impedance between the substrate 24 and the ground pads. The bottom ground pad structure 26 and the contacts 28 may be embedded in insulating material(s) 30.

The bottom ground pad structure 26 in the first embodiment has a generally square shape from a top view (see e.g., FIG. 1), for example. Each corner of the bottom ground pad structure 26 has a bottom corner plate portion 32 located under the ground probe pads G (see e.g., FIGS. 1–3). Bottom inter-ground connecting lines 34 extend between and electrically connect to the bottom corner plate portions 32. The bottom inter-ground connecting lines 34 preferably have smaller widths than the bottom corner plate portions 32, as shown in FIGS. 1–3. Using smaller widths for the bottom inter-ground connecting lines 34 reduces or minimizes the parasitic capacitance of the ground pads. In other embodiments, however, the bottom interground connecting lines 34 may have a same or greater width than the bottom corner plate portions 34.

Bottom signal shield plates 36 extend between and electrically connect to the bottom corner plate portions 32. As indicated in FIG. 4, the bottom signal shield plates 32 are located below signal probe pads S. Hence, the bottom signal shield plates 36 provide a grounded shield under the signal probe pads S. Preferably, the bottom signal shield plates 36 have a same width as the bottom corner plate portions 32, as is shown in FIGS. 1 and 4, for example. But in other embodiments (not shown), the bottom signal shield plates 36 may have smaller or larger widths than the bottom corner plate portions 32. Also, it is preferred that the ground shielding for the signal probe pads S provided in the $M_1$ layer extends beyond the profile of the signal probe pads S in every direction to prevent peripheral fringe capacitance to the substrate 24. Because the bottom signal shield plates 36 are located in the bottom metal layout M1, the bottom inter-ground connecting lines 34 may be eliminated in other embodiments (not shown).

Figure 5:
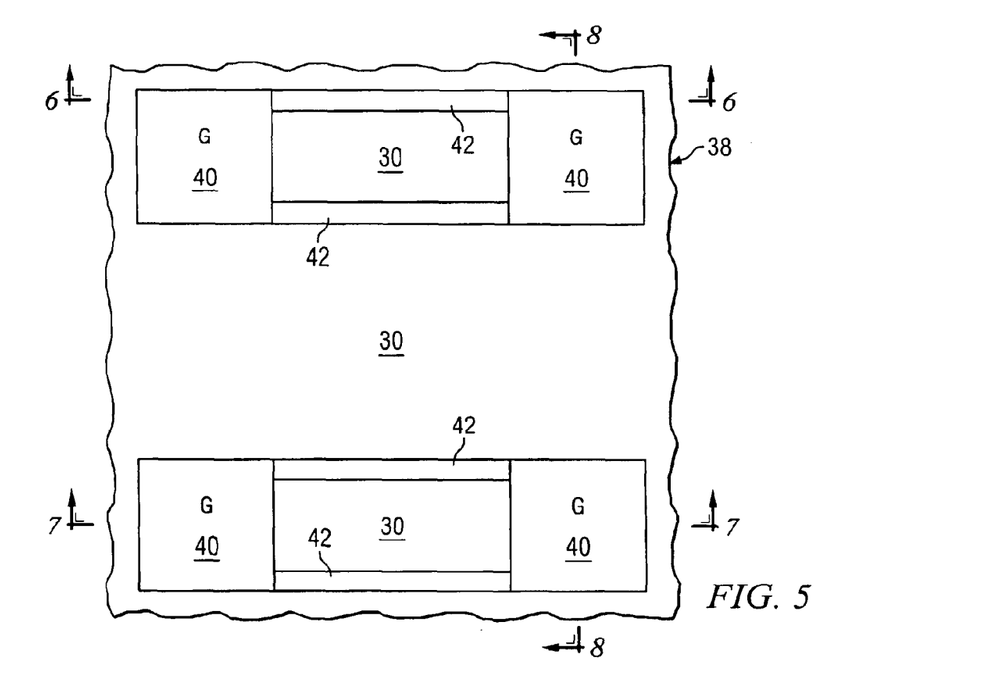
FIGS 5–8 show various views of an intermediate metal layout of the first embodiment.
Figure 6:
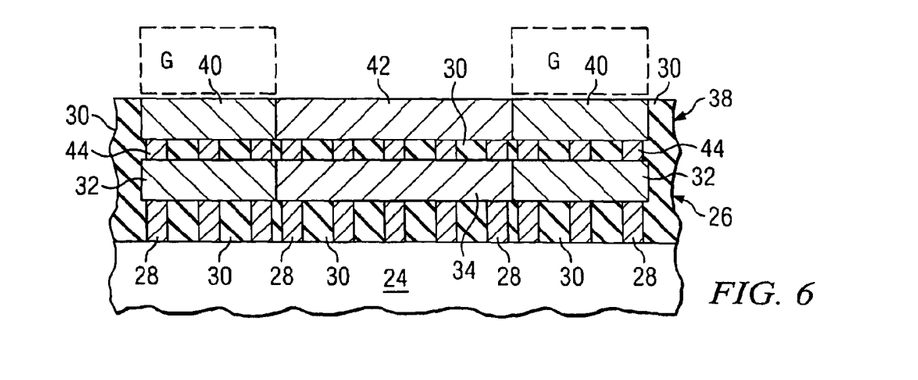

Referring now to FIGS. 5–8, the intermediate metal layout ($M_2$–$M_{TOP-1}$) has an intermediate ground pad structure 38. The intermediate ground pad structure 38 of the first embodiment has intermediate corner plate portions 40 located above the bottom corner plate portions 32 and below the ground probe pads G. The intermediate corner plate portions 40 may be electrically connected to each other via intermediate inter-ground connecting lines 42, as shown in FIGS. 5 and 6. The intermediate inter-ground connecting lines 42 preferably have smaller widths than the intermediate corner plate portions 40, as shown in FIG. 5. Using smaller widths for the inter-ground connecting lines 42 reduces or minimizes the parasitic capacitance of the ground pads. In other embodiments, however, the intermediate inter-ground connecting lines 42 may have a same or greater width than the intermediate corner plate portions 40.

Figure 7:
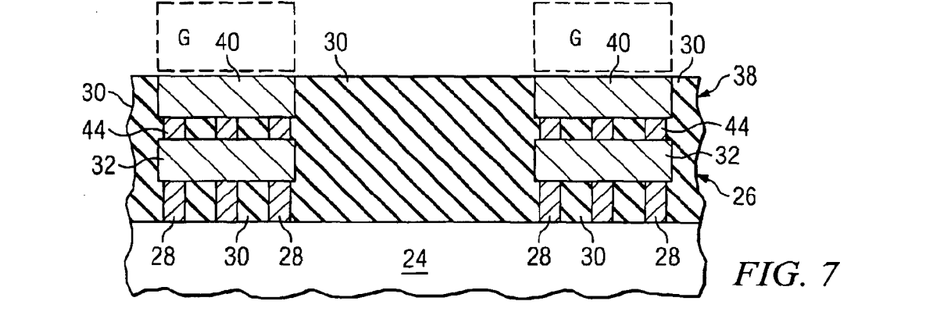
Figure 8:
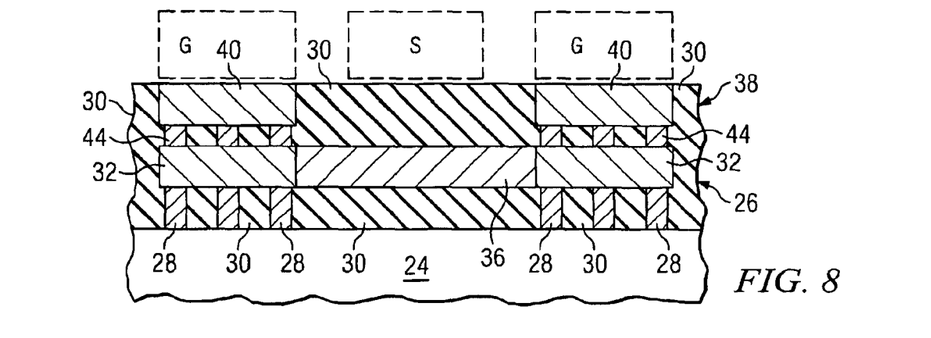

The intermediate ground pad structure 38 is electrically connected to the bottom ground pad structure 26 via an intermediate series of contacts 44, as shown in FIGS. 6–8. If there are multiple levels or layers of intermediate ground pad structures 38, each level may be the same or different.

Figure 9:
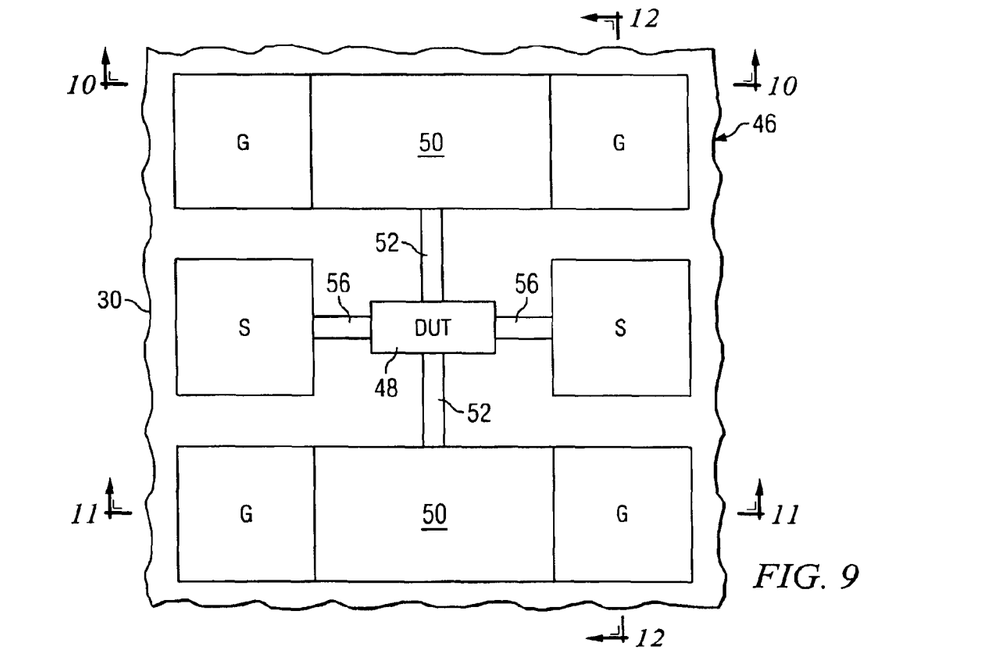
FIGS 9–12 show various views of a top layer of the first embodiment.
Figure 10:
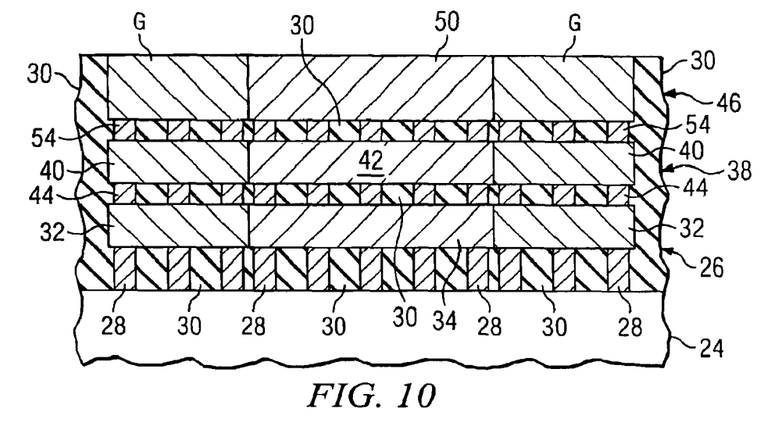
Figure 11:
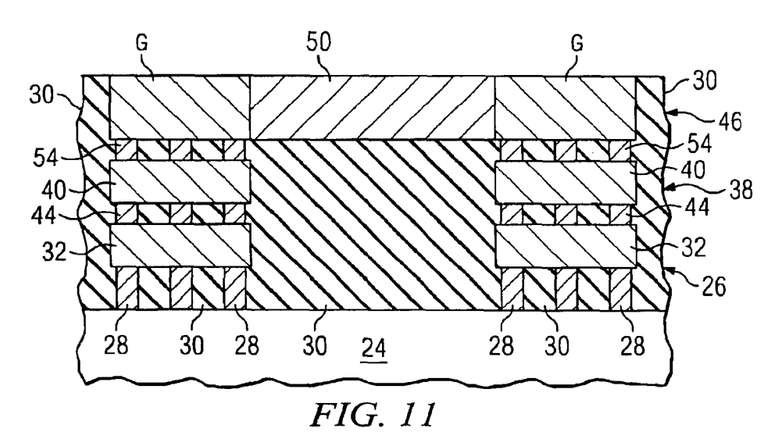
Figure 12:
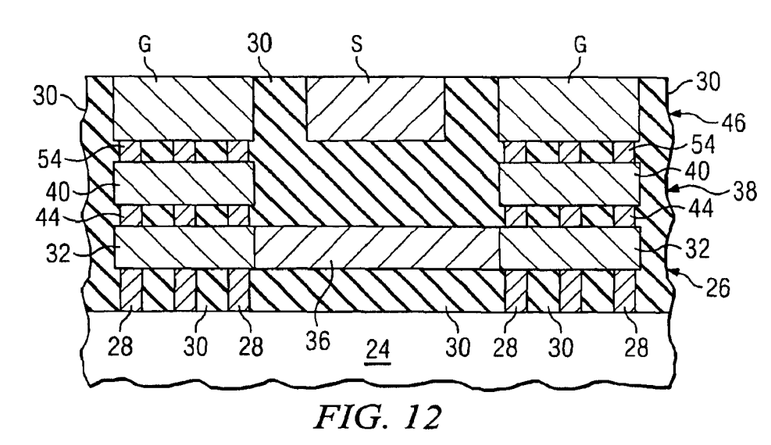

Referring now to FIGS. 9–12, the top metal layout $M_{TOP}$ has a top layer structure 46 that includes the ground probe pads G, the signal probe pads S, and the DUT 48. Top inter-ground connecting lines 50 extend between and electrically connect the ground probe pads G, as shown in FIGS. 9–11. The top inter-ground connecting lines 50 preferably have widths the same as the ground probe pads G, as shown in FIG. 9, to reduce or minimize parasitic feed line resistance when the leads 52 to the DUT 48 are connected to the ground probe pads G via the top inter-ground connecting lines 50. In other embodiments, however, the top inter-ground connecting lines 50 may have smaller or larger widths than the ground probe pads G.

The ground probe pads G and/or the top inter-ground connecting lines 50 may be electrically connected to the uppermost intermediate ground pad structure 38 (at $M_{TOP-1}$) via a top series of contacts 54, as shown in FIGS. 10–11. Note in FIG. 12 that the signal probe pad S is isolated from the surrounding ground structures G, 50, 38, 26 by the insulating material(s) 30 there between. Preferably, the signal probe pads S are only located in the top metal layout MTOP. The DUT 48 may be located inside the top metal layout $M_{TOP}$ (e.g., as part of the top layer structure 46 of the tester), as shown in FIG. 9. The DUT 48 may vary for providing different testers. The DUT 48 is electrically connected to the ground probe pads G and the signal probe pads S by the leads 52, 56. In the illustrative embodiment shown in FIG. 9, signal leads 56 connect directly to the signal probe pads S and ground leads 52 connect to the top inter-ground connecting lines 50. In other embodiments, the ground leads 52 may be connected directly to the ground probe pads G and/or some other part of the tester structure that will be electrically connected to ground.

Figure 13:
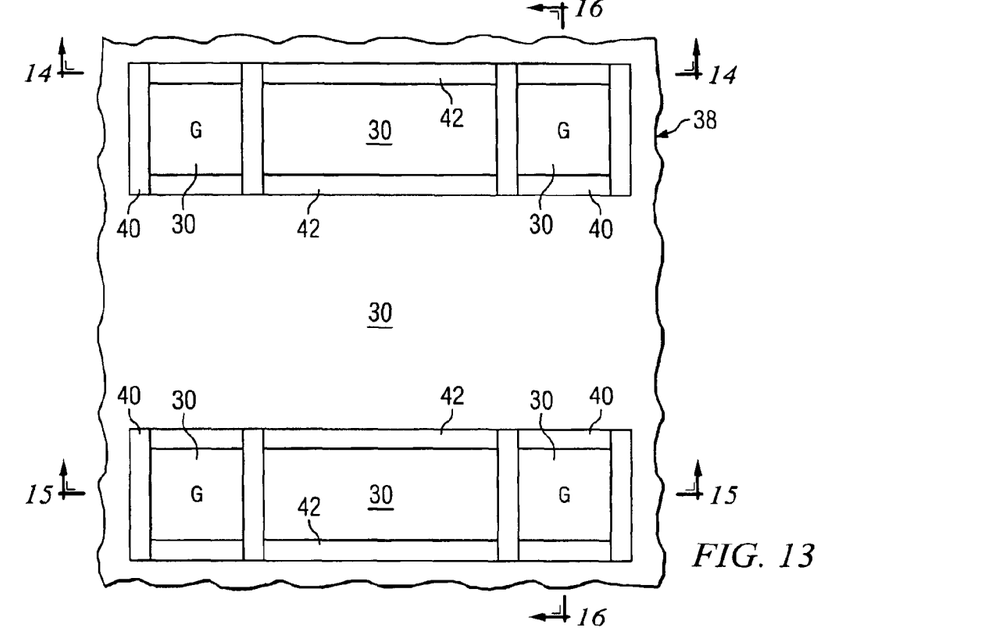
FIGS 13–16 show various views of an intermediate metal layout of the second embodiment.
Figure 14:
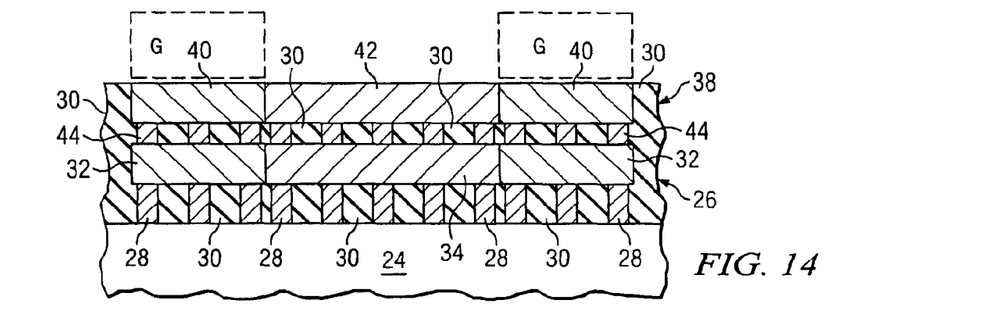
Figure 15:
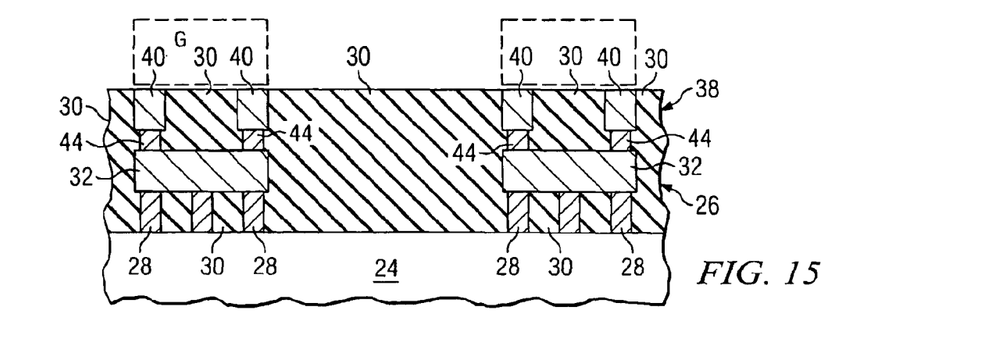
Figure 16:
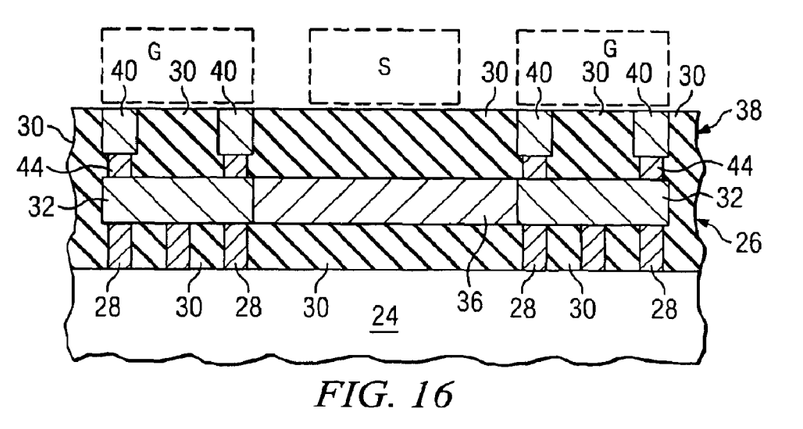
Figure 17:
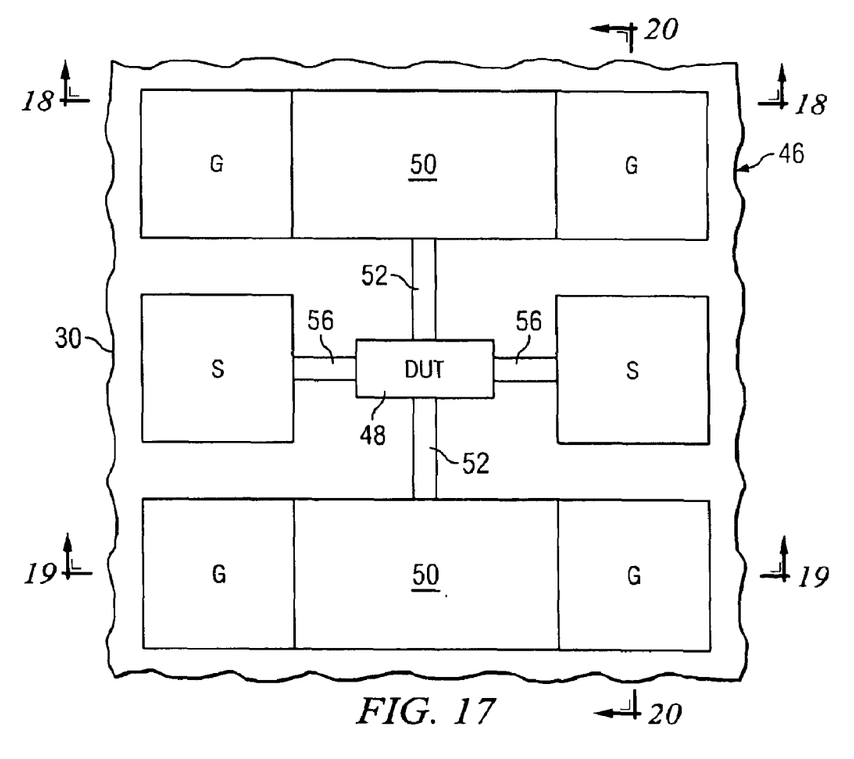
FIGS 17–20 show various views of a top layer of the second embodiment.
Figure 18:
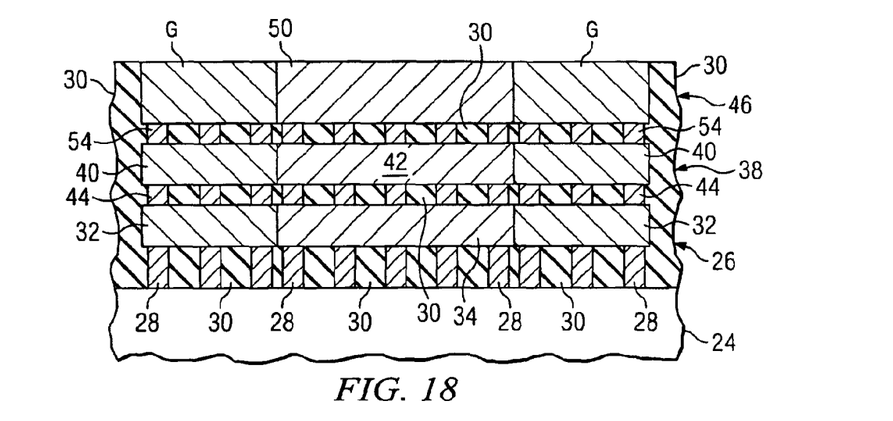
Figure 19:
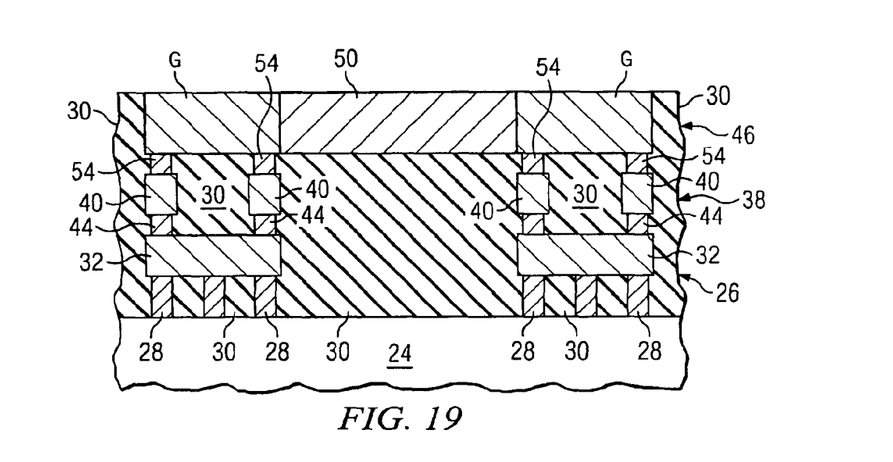
Figure 20:
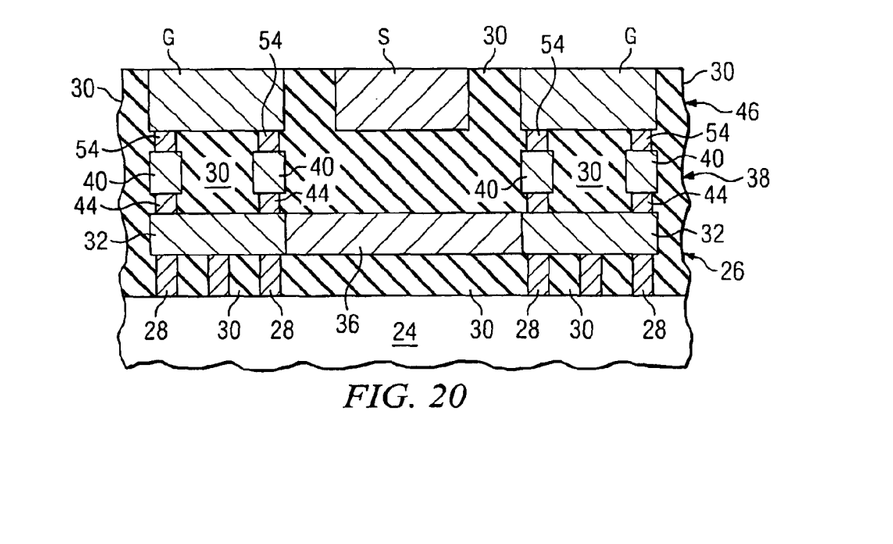

Referring now to FIGS. 13–16, the second embodiment will be discussed. The second embodiment has the same bottom metal layout Ml as the first embodiment, shown in FIGS. 1–4. As shown in FIGS. 13, 15, and 16, the intermediate corner portions 40 of the second embodiment are hollow-box-shaped structures, rather than plate structures. The intermediate corner portions 40 may be filled with insulating material(s) 30. Using hollow-box-shaped structures for the corner portions 40 reduces or minimizes the parasitic capacitance of the ground pads. In another embodiment (not shown), some intermediate layers may have intermediate corner portions 40 like that of the second embodiment, while other intermediate layers have intermediate corner plate portions 40 like that of the first embodiment.

Referring to FIGS. 17–20, the top metal layout $M_{TOP}$ of the second embodiment is shown, which is the same as the top metal layout $M_{TOP}$ of the first embodiment (see e.g., FIG. 9). With the benefit of this disclosure, one of ordinary skill in the art will likely realize other possible embodiments of the present invention that provide variations upon the first and second embodiments, for example.

The conductive structures (bottom ground pad structure 26, intermediate ground pad structure 38, probe pads S and G, top connecting lines 50, and leads 52, 56) for an embodiment of the present invention may be made from a variety of conducting materials, including but not necessarily limited to: aluminum, copper, aluminum-copper alloys, aluminum alloys, copper alloys, other metals, polysilicon, or any combination thereof, for example. For devices having geometries greater than about 0.13 µm (e.g., 0.18 µm, 0.25 µm), aluminum-copper is often preferred and used during actual production for these conductive structures. And for devices having geometries of about 0.13 µm or less (e.g., 0.13 µm, 90 nm), copper is sometimes preferred and used during actual production for these conductive structures, for example.

The contacts 28, 44, 54 between layouts $M_1$, $M_2$–$M_{TOP}$, and $M_{TOP}$ may be made from a variety of materials, including but not limited to: metal, tungsten, copper, or any combination thereof, for example. For devices having geometries greater than about 0.13 µm (e.g., 0.18 µm, 0.25 µm), tungsten is often preferred and used during actual production for the contacts 28, 44, 54. And for devices having geometries of about 0.13 µm or less (e.g., 0.13 µm, 90 nm), copper is sometimes preferred and used during actual production for the contacts 28, 44, 54, for example. The insulating material(s) 30 used between the structures and contacts on the various layers may be the same, or various combinations and placements of different materials may be used. The insulating material(s) 30 may be selected from a variety of materials, including but not necessarily limited to: oxide, silicon dioxide, silicon nitride, FSG, low-k dielectric material, LK related materials, SILK, or any combination thereof, for example. For devices having geometries greater than about 0.13 µm (e.g., 0.18 µm, 0.25 µm), silicon dioxide is often preferred and used during actual production for the insulating material 30. And for devices having geometries of about 0.13 µm or less (e.g., 0.13 µm, 90 nm), FSG and LK related material is sometimes preferred and used during actual production for the insulating material 30, for example. Typically the materials used for forming the tester structures will be dictated by and/or the same as those used in forming the IC devices because the testers are usually formed using the same processes and formed simultaneously with the IC devices.

In the example embodiments shown in FIGS. 1–20, the DUT has been shown only in the top metal layout ($M_{TOP}$). However, in other embodiments the DUT also may be located in any other level or any combination of levels ($M_1$, $M_2$–$M_{TOP-1}$, $M_{TOP}$). Also, the DUT may extend to the substrate or may be created from the substrate, for example. Hence, as another example, the DUT may stem from the substrate, extend through the intermediate metal layouts ($M_1$–$M_{TOP-1}$) to the top metal layout ($M_{TOP}$). With the benefit of this disclosure, one of ordinary skill in the art will likely realize many other configurations for the DUT.

One of the advantages provided by an embodiment of the present invention may be the minimizing of coupling between probe ports because the signal probe pads S are isolated from the substrate 24 by the tester structure. The shielded signal probe pads S in an embodiment of the present invention may provide better noise characterization of devices because the substrate coupling through the signal pad may be reduced or minimized. Another advantage of an embodiment of the present invention may be the simplification of de-embedding the pad parasitics because the equivalent circuit may be purely or mostly capacitive. Yet another advantage provided by an embodiment of the present invention may be the reduction or minimization of parasitic capacitance of the ground probe pads G. With the benefit of this disclosure, one of ordinary skill in the art may realize other advantages provided by an embodiment of the present invention.

It will be appreciated by those skilled in the art having the benefit of this disclosure that embodiments of the present invention provide improved tester structures for DUTs. It should be understood that the drawings and detailed description herein are to be regarded in an illustrative rather than a restrictive manner, and are not intended to limit the invention to the particular forms and examples disclosed. On the contrary, the invention includes any further modifications, changes, rearrangements, substitutions, alternatives, design choices, and embodiments apparent to those of ordinary skill in the art, without departing from the spirit and scope of this invention, as defined by the following claims. Thus, it is intended that the following claims be interpreted to embrace all such further modifications, changes, rearrangements, substitutions, alternatives, design choices, and embodiments.

What is claimed is:

1. A tester for a semiconductor device, comprising:
   a bottom ground pad structure electrically connected to a substrate, the bottom ground pad structure comprising a bottom signal shield plate;
   an intermediate ground pad structure electrically connected to the bottom ground pad structure, the intermediate ground pad structure being located over the bottom ground pad structure; and
   a top layer located over the intermediate ground pad structure, the top layer comprising a device under test (DUT), a ground probe pad, a signal probe pad, and leads, wherein the DUT is electrically connected to the ground probe pad and the signal probe pad via the leads, wherein the ground probe pad is electrically connected to the intermediate ground pad structure, and wherein the signal probe pad is located over the bottom signal shield plate.

2. The tester of claim 1, further comprising a bottom series of contacts located between the bottom ground pad structure and the substrate, wherein the bottom ground pad structure is electrically connected to the substrate via the bottom series of contacts.

3. The tester of claim 1, further comprising an intermediate series of contacts located between the bottom ground pad structure and the intermediate ground pad structure, wherein the intermediate ground pad structure is electrically connected to the bottom ground pad structure via the intermediate series of contacts.

4. The tester of claim 1, further comprising a top series of contacts located between the intermediate ground pad structure and the top layer, wherein the ground probe pad is electrically connected to the intermediate ground pad structure via the top series of contacts.

5. The tester of claim 1, further comprising:
   another ground probe pad located in the top layer; and
   an inter-ground connecting line extending between the ground probe pads, wherein the ground probe pads are electrically connected to each other via the inter-ground connecting line.

6. The tester of claim 5, wherein the inter-ground connecting line has about a same width as the ground probe pads.

7. The tester of claim 5, wherein at least one of the leads is electrically connected between the inter-ground connecting line and the DUT, wherein the ground probe pads are electrically connected to the DUT via the inter-ground connecting line.

8. The tester of claim 1, wherein the intermediate ground pad structure comprises two corner portions and an inter-ground connecting line, wherein the inter-ground connecting line extends between and electrically connects the two corner portions.

9. The tester of claim 8, wherein the inter-ground connecting line has a smaller width than the corner portions.

10. The tester of claim 8, wherein each of the corner portions has a plate shape.

11. The tester of claim 8, wherein each of the corner portions has a hollow box shape.

12. The tester of claim 1, further comprising a second intermediate ground pad structure located between the bottom ground pad structure and the top layer, wherein the second intermediate ground pad structure is electrically connected to the ground probe pads and the bottom ground pad structure.

13. A tester for a semiconductor device, comprising:
a bottom layer comprising a bottom ground pad structure, the bottom ground pad structure being electrically connected to a substrate via a bottom series of contacts, the bottom ground pad structure comprising a bottom signal shield plate;
at least one intermediate layer, each intermediate layer comprising an intermediate ground pad structure, the intermediate ground pad structure being electrically connected to the bottom ground pad structure via an intermediate series of contacts; and
a top layer comprising a device under test (DUT), a ground probe pad, a signal probe pad, and leads, wherein the DUT is electrically connected to the ground probe pad and the signal probe pad via the leads, wherein the ground probe pad is electrically connected to an uppermost one of the at least one intermediate ground pad structure via a top series of contacts, and wherein the signal probe pad is located over the bottom signal shield plate.

14. The tester of claim 13, further comprising:
another ground probe pad located in the top layer; and
an inter-ground connecting line extending between the ground probe pads, wherein the ground probe pads are electrically connected to each other via the inter-ground connecting line.

15. The tester of claim 14, wherein the inter-ground connecting line has about a same width as the ground probe pads.

16. The tester of claim 14, wherein at least one of the leads is electrically connected between the inter-ground connecting line and the DUT, wherein the ground probe pads are electrically connected to the DUT via the inter-ground connecting line.

17. The tester of claim 13, wherein the intermediate ground pad structure comprises two corner portions and an inter-ground connecting line, wherein the inter-ground connecting line extends between and electrically connects the two corner portions.

18. The tester of claim 17, wherein the inter-ground connecting line has a smaller width than the corner portions.

19. The tester of claim 17, wherein the corner portion has a plate shape.

20. The tester of claim 17, wherein the corner portion has a hollow box shape.

21. A tester for a semiconductor device, comprising:
a bottom layer comprising a bottom ground pad structure, the bottom ground pad structure being electrically connected to a substrate via a bottom series of contacts, the bottom ground pad structure comprising:
four bottom corner portions, and
two bottom signal shield plates, wherein each bottom signal shield plate extends between and electrically connects two of the bottom corner portions;
at least one intermediate layer, each intermediate layer comprising an intermediate ground pad structure, the intermediate ground pad structure being electrically connected to the bottom ground pad structure via an intermediate series of contacts, the intermediate ground pad structure comprising:
four intermediate corner portions, each intermediate corner portion being located over one of the bottom corner portions, and
two intermediate inter-ground connecting lines, wherein each intermediate inter-ground connecting line extends between and electrically connects two of the intermediate corner portions, and wherein each intermediate inter-ground connecting line has a smaller width than the intermediate corner portions; and
a top layer comprising a device under test (DUT), four ground probe pads, two top interground connecting lines, two signal probe pads, and leads, wherein the DUT is electrically connected to the ground probe pads and the signal probe pads via the leads, wherein the ground probe pads are electrically connected to an uppermost one of the at least one intermediate ground pad structure via a top series of contacts, wherein each signal probe pad is located over one of the bottom signal shield plates, and wherein each ground probe pad is located over one of the intermediate corner portions.

22. The tester of claim 21, wherein each intermediate corner portion has a plate shape.

23. The tester of claim 21, wherein each intermediate corner portion has a hollow box shape.

* * * * *